(12) United States Patent
Fink et al.

(10) Patent No.: US 8,090,495 B2
(45) Date of Patent: Jan. 3, 2012

(54) CHECKING OF REPAIRS FOR ELECTRONIC VEHICLE SYSTEMS

(75) Inventors: Bernhard Fink, Köngen (DE); Peter Irkes, Auenwald (DE); Markus Scholz, Winnenden (DE); Klaus Weiss, Gruibingen (DE)

(73) Assignee: Daimler AG, Stuttgart (DE)

( * ) Notice: Subject to any disclaimer, the term of this patent is extended or adjusted under 35 U.S.C. 154(b) by 973 days.

(21) Appl. No.: 11/792,002

(22) PCT Filed: Aug. 23, 2005

(86) PCT No.: PCT/EP2005/009077
§ 371 (c)(1),
(2), (4) Date: Mar. 3, 2008

(87) PCT Pub. No.: WO2006/024424
PCT Pub. Date: Mar. 9, 2006

(65) Prior Publication Data
US 2008/0221751 A1    Sep. 11, 2008

(30) Foreign Application Priority Data
Aug. 31, 2004 (DE) .......................... 10 2004 042 002

(51) Int. Cl.
G01M 17/007    (2006.01)
(52) U.S. Cl. .......................................... 701/35; 701/29
(58) Field of Classification Search .............. 701/29, 701/35, 66, 97, 32, 33, 30; 340/439, 459, 340/825.15, 931
See application file for complete search history.

(56) References Cited

U.S. PATENT DOCUMENTS
4,271,402 A    6/1981    Kastura et al.
(Continued)

FOREIGN PATENT DOCUMENTS
DE    199 21 845    11/2000
(Continued)

OTHER PUBLICATIONS
International Standard, ISO 14229, "Road Vehicles—Diagnostic Systems—Diagnostic Services Specification," First Edition, Jul. 15, 1998.
(Continued)

*Primary Examiner* — Drew Brown
(74) *Attorney, Agent, or Firm* — Fitch Even Tabin & Flannery; Norman N. Kunitz (57) ABSTRACT

The invention relates to a computer-based diagnostic tester which can exchange information with the control devices installed in the motor vehicle using a diagnostic program via a diagnostic interface and via data lines. A method for improved checking of repairs is also presented with the diagnostic tester. The motor vehicle-mounted control devices have program routines for self-diagnostics of the control devices and are capable of storing identified faults in the form of fault codes in reserved memory areas. The diagnostic program which is implemented in the diagnostic tester reads the fault codes out from the reserved memory areas, interprets the fault codes and displays them on a display together with the interpretations. In order to check to what extent repairs which have been performed have been successfully concluded, status polling is carried out using the diagnostic program implemented in the diagnostic tester. During this status polling, the status information of all the fault codes known in the system is interrogated and evaluated. In the process, all the fault codes whose fault setting conditions have either been tested positively or whose test requirements were not present in order to be able to carry out a test are displayed. The fault codes which are to be displayed are firstly stored here in one or more primary first fault memories, read out and then copied into a secondary, second fault memory. This permits the use of the total reset of the primary fault memories which is prescribed in the USA for diagnostic systems without information which is relevant to the checking of repairs in the second fault memory being lost.

18 Claims, 8 Drawing Sheets

U.S. PATENT DOCUMENTS

| | | | |
|---|---|---|---|
| 4,926,352 A | | 5/1990 | Staffe |
| 5,077,671 A | * | 12/1991 | Leslie et al. ............... 701/3 |
| 5,265,468 A | | 11/1993 | Holst et al. |
| 6,006,146 A | * | 12/1999 | Usui et al. ............... 701/29 |
| 7,239,946 B2 | * | 7/2007 | Sowa ............... 701/29 |
| 7,660,662 B2 | * | 2/2010 | Groer et al. ............... 701/114 |
| 7,856,299 B2 | * | 12/2010 | Fink et al. ............... 701/33 |
| 2007/0088465 A1 | * | 4/2007 | Heffington ............... 701/1 |
| 2008/0119981 A1 | * | 5/2008 | Chen ............... 701/33 |
| 2009/0216401 A1 | * | 8/2009 | Underdal et al. ............... 701/35 |
| 2009/0216493 A1 | * | 8/2009 | Underdal et al. ............... 702/183 |
| 2009/0216584 A1 | * | 8/2009 | Fountain et al. ............... 705/7 |
| 2009/0254242 A1 | * | 10/2009 | Kura ............... 701/33 |
| 2009/0271064 A1 | * | 10/2009 | Enomoto et al. ............... 701/33 |
| 2009/0306849 A1 | * | 12/2009 | Blanz et al. ............... 701/33 |
| 2010/0292892 A1 | * | 11/2010 | Enomoto et al. ............... 701/35 |

FOREIGN PATENT DOCUMENTS

| | | |
|---|---|---|
| EP | 0 819 928 | 1/1998 |
| JP | 07271589 | 10/1995 |
| JP | 09210865 | 8/1997 |

OTHER PUBLICATIONS

International Standard, ISO 14230-2, "Road Vehicles—Diagnostic Systems—Keyword Protocol 2000— Part 2: Data Link Layer," First Edition, Mar. 15, 1999.

International Standard, ISO 14230-3, "Road Vehicles—Diagnostic Systems—Keyword Protocol 2000— Part 3: Application Layer," First Edition Mar. 15, 1999.

SAE International Surface Vehicle Standard, Superseding J1979, Sep. 1997.

* cited by examiner

CHECKING OF REPAIRS FOR ELECTRONIC VEHICLE SYSTEMS

CROSS REFERENCE TO RELATED APPLICATION

This application is the National Stage filing under 35 U.S.C. 371 of International Application No. PCT/EP2005/009077, filed Aug. 23, 2005, and claims priority of German Patent Application 10 2004 042 002.5, filed Aug. 31, 2004 the subject matter of which, in their entireties, are incorporated herein by reference.

BACKGROUND OF THE INVENTION

The invention relates to a diagnostic system and a diagnostic tester for checking motor vehicle control devices with which not only is it possible to find faults, as previously customary, but also with which it is likewise possible to check whether a repair which has been performed was successful. The diagnostic tester is likewise used to present a method for the improved checking of repairs. The diagnostic system and diagnostic tester correspond in particular to the legal requirements for diagnostic systems in the USA.

Diagnostic systems and diagnostic testers for motor vehicle control devices are nowadays predominantly computer based in motor vehicle workshops. BMW were leaders in the introduction of computer-based diagnostic testers in 1994 with the diagnostic system BMW-DIS which set the standard for contemporary diagnostic systems and diagnostic testers in motor vehicle workshops. This system is described, for example, in the vocational training manual by Rauner/Schreier/Spöttel: "Die Zukunft computergestützter Kfz-Diagnose [The future of computer-supported motor vehicle diagnostics]" published by Bertelsmann in Bielefeld, 2002, ISBN 3-7639-3022-1. The following diagnostic testers have repeatedly resorted to the basic structure of this diagnostic system. For example, there is also a German patent application by Bosch, DE 199 21 845 A1 which is mentioned here by way of example because it summarizes this basic structure in a particularly concise and brief way. A diagnostic test device for motor vehicles is described in which programmable control devices are provided with self-diagnostic means in the motor vehicle, said means using program control to control and monitor the engine controller and other systems of the motor vehicle, generate fault codes and store them and said means can be connected to an external diagnostic tester via a motor vehicle-mounted diagnostic/test plug. The invention is also based on such a basic structure for a diagnostic tester.

The interface or the diagnostic plug for connecting an external diagnostic tester to the motor vehicle-mounted control devices was in the past, and is to a certain extent still today, the object of efforts at standardization. In particular in the USA these efforts at standardization with which access to motor vehicle-mounted control devices, and thus the ability to perform diagnostics on them, is made possible and regulated, still involve measures by legislators. A standard which has become established is referred to as the keyword protocol 2000. The standardization bases for this keyword protocol 2000 can be found in the international standard ISO 14 230-3, which is concerned with the application layer, and in ISO 14 230-2 which is concerned with what is referred to as the data link layer. A supplementary standard on which the keyword protocol 2000 is based and which has become a component of the above-mentioned standards is the service vehicle standard SAE J1979. In particular the possibilities for reading out the data memories in the control devices which are provided for a diagnostic tester by the keyword protocol 2000 are significant for the invention described here.

Known diagnostic systems and diagnostic testers are restricted to reading out existing fault codes from the control devices in the motor vehicle, processing and interpreting them with a diagnostic program and displaying the result of this interpretation on a screen of the diagnostic tester. In the motor vehicle workshop, a motor vehicle mechanic then works through the displayed list of deficiencies, during which process he can call up further information about the individually specified deficiencies using the diagnostic tester. In this context, further technical information resources such as technical drawings and of course the repair instructions with which he can eliminate the detected fault are of particular interest for him. If the motor vehicle mechanic has worked through the list of deficiencies, he uses the diagnostic tester to clear the stored and read-out fault codes in the motor vehicle-mounted control devices and in the diagnostic tester itself. Final checking as to whether the repairs which have been performed were successful or whether consequential faults have arisen as a result of the repair, is performed with a final test drive depending on the working organization in the motor vehicle workshop. Diagnostic systems and diagnostic testers which are known to the patent applicant do not support the quality checking of the repairs performed. They are not suitable for this either since the list of deficiencies and the fault codes in the control devices are cleared by the motor vehicle mechanic by a clear command. Of course, as a result the information about a malfunction which has occurred once and been detected is lost. Therefore, until now a diagnostic tester did not provide a motor vehicle mechanic with any support as to whether or not his repair was successful.

Taking the previously described prior art as a starting point, the aim of the invention is therefore to specify a diagnostic system and a diagnostic tester which permit improved checking of repairs using the diagnostic tester. Particular emphasis is placed here on the legal prohibition to clear individual faults in control devices relating to exhaust gas in the USA.

SUMMARY OF THE INVENTION

This object is achieved with a diagnostic system and a diagnostic tester corresponding to the independent claims. Advantageous embodiments of the invention are presented in the dependent claims or clarified in the following description.

The solution is arrived at mainly with a computer-based diagnostic tester which can exchange information with the control devices installed in the motor vehicle using a diagnostic program via a diagnostic interface and via data lines. The motor vehicle-mounted control devices have program routines for self-diagnostics of the control devices and are capable of storing identified faults in the form of fault codes in reserved memory areas. The diagnostic program which is implemented in the diagnostic tester reads the fault codes out from the reserved memory areas, interprets the fault codes and displays them on a display together with the interpretations. In order to check to what extent repairs which have been performed have been successfully concluded, status polling is carried out using the diagnostic program implemented in the diagnostic tester. During this status polling, the status information of all the fault codes known in the system is interrogated and evaluated. In the process, all the fault codes whose fault setting conditions have either been tested positively or whose test requirements were not present in order to be able to carry out a test are displayed. The fault codes which are to be displayed are firstly stored here in one or more primary first fault memories and are copied into a secondary, second fault memory before the primary fault memories are cleared. This permits the use of the total reset of the primary fault memories which is prescribed in the USA for diagnostic systems without information which is relevant to the diagnostics in the second fault memory being lost. The content of the secondary fault memory is the basis for the fault codes to be displayed on the display of the diagnostic tester.

Status polling mainly has the advantage that not only those faults whose fault setting conditions were once positively met in the past but also the potentially possible faults whose functions could not be checked because the test requirements were not present for this are displayed in the form of fault codes on the diagnostic tester. In order to support the workshop mechanic in the motor vehicle workshop, the status polling points to the display of the diagnostic tester as long as a list of deficiencies appears, until all the identified faults and also all potential faults have been tested in accordance with the test requirements and the test result has not yielded a positive infringement of a fault setting condition. For repair measures which have been carried out this means that the repair measure is not concluded until the test requirements for the repair measure which has been carried out have been run through at least once with the diagnostic tester and this run has shown that there is no longer a fault setting condition present for the measure checked.

In one advantageous embodiment of the invention, the clearing of fault codes in the secondary, second fault memory using the diagnostic tester is tied to the fact that at least one further diagnostic run has been carried out for the fault code to be cleared, the test requirements for checking the respective fault codes having been met during this diagnostic run and the status information supplying the result "tested". This has the advantage that once faults have been diagnosed they are then not removed from the display of the diagnostic tester until a repair which has possibly been carried out has been monitored and checked at least once with the diagnostic tester and found to be satisfactory. Incorrectly carried out repair measures can thus be identified using the diagnostic tester directly after the repair. It is even more important that with the prescribed status polling those potential fault possibilities which were only found to be satisfactory because the test requirements for appropriate checking were not present are also identified. This is significant in particular if a repair is to be carried out by completely exchanging, for example, an actuator or a sensor. According to the previously known prior art, each diagnostic tester would find the newly installed actuator or sensor to be satisfactory only because no fault codes were stored in the fault memory of the associated control device after the primary fault memories were cleared. On the other hand, with the invention fault codes with the status information "not tested" remain in the secondary fault memory until the repair has been tested at least once in accordance with the test requirements applicable for the replacement part. Repair is not concluded until no activated fault codes are stored in the primary fault memories and there are no fault codes with the status information "not tested" still stored in the secondary fault memory B. The menu prompting or the screen display of the diagnostic tester such as is described here, alerts the workshop mechanic to fault possibilities which have not been tested and in the process helps him to think of checking the executed repair measures at least once in a satisfactory fashion. The test requirements for each known fault code are appropriately implemented here in the diagnostic program of the diagnostic tester so that the workshop mechanic does not need to commit to memory the predefined test requirements for each possible fault in the motor vehicle.

In one advantageous embodiment of the invention, the status check is initiated by the motor vehicle mechanic using the diagnostic tester. To do this, during the menu prompting of the diagnostic tester a menu item which is reserved for the status polling and during the activation of which a status check of the fault displayed by the diagnostic tester is performed can be provided. This has the advantage that the motor vehicle mechanic can use the diagnostic tester near to the repair and whenever he believes he has concluded a repair measure he can check this repair measure immediately with the diagnostic tester.

In less preferred embodiments of the invention, the status checks can be started automatically by the diagnostic tester in that, for example after the diagnostic tester has been connected to the diagnostic interface of the motor vehicle, a status check of the fault codes is initiated and carried out by the diagnostic tester at regular time intervals. For this purpose, a clock can run concurrently and a status check can be carried out, for example triggered automatically every 10 minutes.

In one further embodiment, in the diagnostic tester the functions for clearing the fault codes are blocked in the secondary fault memory until a status check is carried out by means of a further diagnostic routine, and both fault-free functioning of the executed repair measure and correct checking of the repair measure have been carried out by reference to the test requirements prescribed for the respective repair. For this purpose, after a repair has taken place, a complete reset of the primary fault memories is carried out. A diagnostic run, during which in the event of a fault the primary fault memories are written to again, is then started. With the result of the diagnostic run, the entries in the secondary fault memory are updated. This embodiment has the advantage that for the motor vehicle mechanic the repair is not ended until all the faults have been eliminated and have also been satisfactorily checked. Random clearing of fault codes once they have been detected by means of clear commands or a complete reset of the primary fault memories can then no longer lead to a service which appears to be satisfactory since the fault codes which are stored in the secondary fault memory continue to be displayed using the diagnostic tester.

In a further embodiment, the fault codes in the secondary fault memory within the control device are cleared if a status check of both the fault-free functioning of the executed repair measure and the correct checking of the repair measure by reference to the test requirements prescribed for the respective fault codes have been carried out. For this purpose, after a repair has taken place, a complete reset of the primary fault memories is carried out. Then, during the ready to test state of fault codes the status of the corresponding fault codes is updated in the secondary fault memory. This embodiment has the advantage that for the motor vehicle mechanic the repair is not ended until all the faults have been eliminated and have also been satisfactorily checked. Random clearing of fault codes once they have been detected by means of clear commands or a complete reset of the primary fault memories can then no longer lead to a service which appears to be satisfactory since the fault codes stored in the secondary fault memory continue to be displayed using the diagnostic tester and the monitoring of the logic occurs completely in the control device.

BRIEF DESCRIPTION OF THE DRAWINGS

Without restricting the generality, the invention will be explained in more detail below using graphic illustrations, in which.

DETAILED DESCRIPTION OF THE INVENTION

Figure 1:
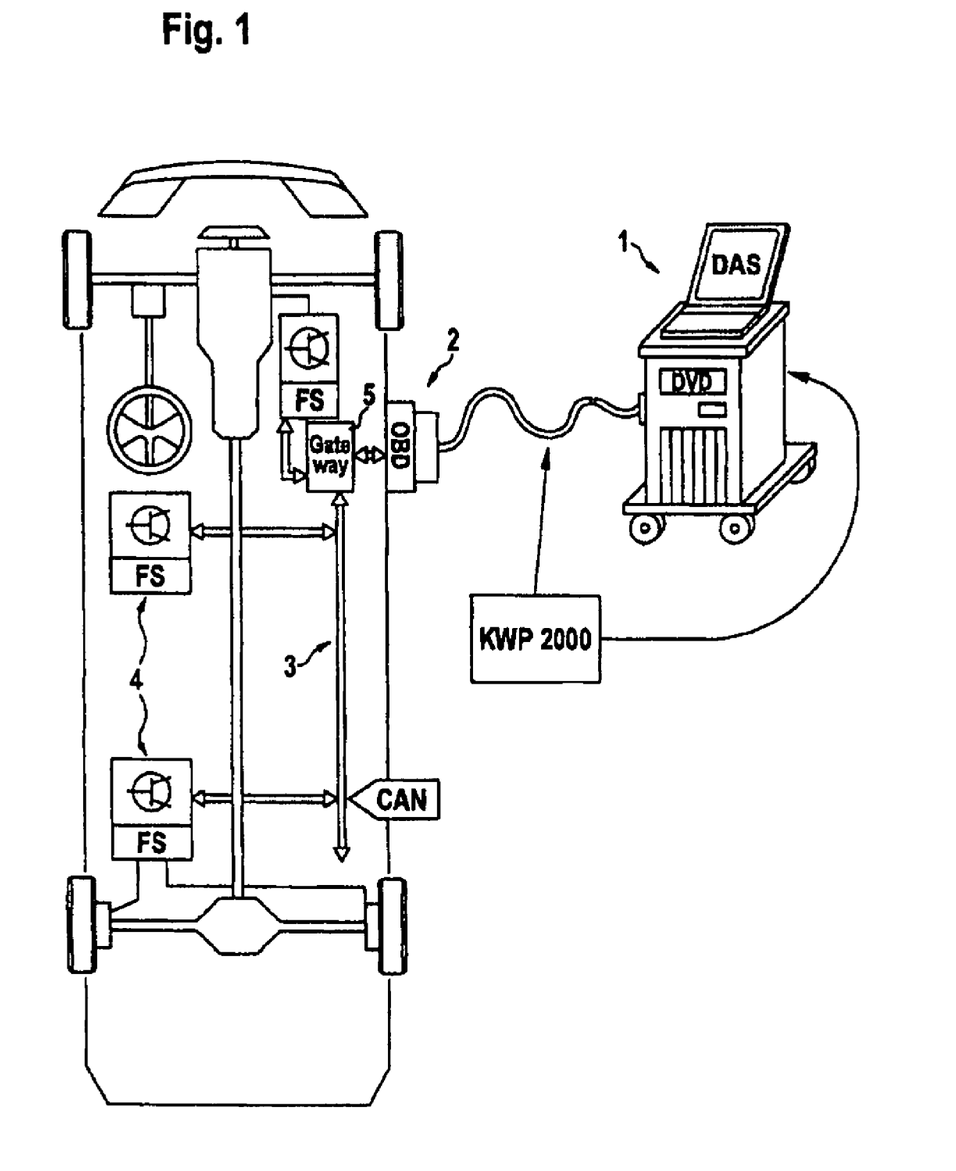
FIG. 1 shows a schematic illustration of a diagnostic tester such as is connected to the control devices in a motor vehicle.

FIG. 1 is a schematic illustration of a situation such as is known today in motor vehicle workshops. For the diagnostics of a motor vehicle, a computer-supported diagnostic tester 1 is connected via a standardized diagnostic interface 2 to the communications network 3 for the control devices 4 in the motor vehicle. Known diagnostic testers are, for example, the DAS system from DaimlerChrysler or the BMW-DIS system which has already been mentioned in the introduction to the description. The control devices 4 installed in the motor vehicle have a communication connection to one another for example via a data bus. A widespread data bus in motor vehicles is here what is referred to as the CAN (Control Area Network) bus. Each of the installed control devices in the motor vehicle has both the communications interfaces and a self diagnostic capability. Within the scope of the self diagnostics of the control devices, faults which have been detected in the control devices using the diagnostic routine are written in codified form as what are referred to as fault codes by the control device software into specially reserved memory areas, referred to as fault memories. In the schematic illustration in FIG. 1, these reserved, nonvolatile memory areas are designated by FM (for fault memory). For communication and for exchange of data between a diagnostic tester and the control devices installed in the motor vehicle a standard has become established which is known by the name keyword protocol 2000 and the specification and standardization of which are repeated in the ISO standard 14 230-3. Insofar as is necessary to understand the invention, more details are also given on this keyword protocol 2000 below in relation to FIG. 2. The control commands and data formats agreed in the keyword protocol 2000 make it possible to read out the codified contents of the fault memories of the individual control devices via the diagnostic interface using the diagnostic tester and to transmit them into the computing system of the diagnostic tester. The standard for the keyword protocol 2000 comprises here two different application possibilities. On the one hand, the standard provides for the communication between the diagnostic tester and control devices to take place via a gateway 5 which, for example, connects the motor vehicle CAN bus to the diagnostic interface 2, or else, as was customary earlier, provides that the fault memories of the control devices can be read out directly into the diagnostic tester via what are referred to as the K and L lines and via the standardized diagnostic interface 2 and stored. In the schematic illustration in FIG. 1, the modern form of access via a CAN bus and thus via a gateway is illustrated. All that is significant for the invention is that there is at least one possible way of being able to read out the fault memories of the control devices using a diagnostic tester. The invention therefore covers all the addressing possibilities between the diagnostic tester and fault memories of the control devices. The keyword protocol 2000 used is also merely one preferred possible way of being able to transfer the data contents of the fault memories from the control devices into the diagnostic tester particularly easily.

Figure 2:
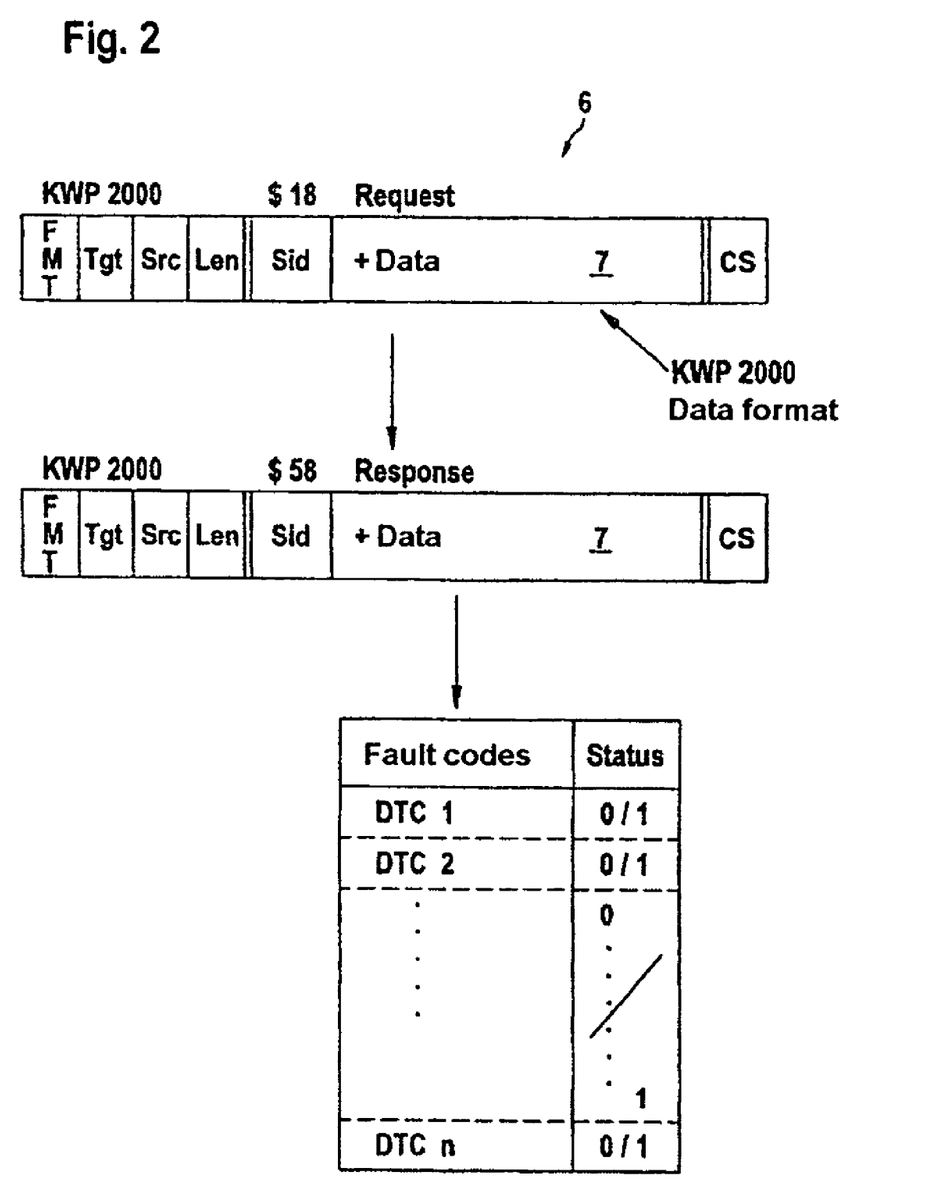
FIG. 2 shows a schematic illustration of data formats such as are agreed in the keyword protocol 2000.

The schematic illustration in FIG. 2 briefly gives details on the keyword protocol 2000. Complete and more detailed information can be found by a person skilled in the art in the ISO standard 14 230-3 already mentioned. The keyword protocol 2000 has defined, specifically for the purposes of motor vehicle diagnostics, a data format and a minimum scope of codified control commands which a control device must at least be able to process in the motor vehicle if it is to correspond to the keyword protocol 2000. The data format used by the keyword protocol is based on the ISO standard 14 230-2, referred to as the data link layer for the keyword protocol 2000. The structure of such a data format includes up to four different header bytes which contain information about the data format FMT, information about the target address TGT, information about the sender address SRC and information about the length of the data bytes following the header bytes. The header block is always followed by a hexadecimal-codified control command, which is referred to as a service identification SID. The control commands specified in the keyword protocol 2000 can be further subdivided and refined here in a manufacturer-specific fashion. In this case, the useful data block 7 would contain further hexadecimal-codified control commands. The data format corresponding to the keyword protocol 2000 is always concluded with a byte which contains a checksum CS over all the data of the respective message format. The message format just described is used in its basic structure both for enquiries to the control devices and for the responses of the control devices. What is referred to as the $18 requests with the associated $58 response which each keyword protocol 2000-enabled system must contain and be able to process are of particular interest for the invention here. The requests and the response are codified here merely using the hexadecimal coding means 18 or 58 in order to determine the service identification, and thus determine the useful data which is to be transmitted and which has to be contained in the response. The dollar symbol is merely used here in this patent application to show that the numerical code 18 or 58 is a codified control command corresponding to the keyword protocol 2000. If a control device receives an $18 request in a motor vehicle from a diagnostic tester, it always responds with a $58 response. The useful data of the response are always contained here in the data block 7 of the response message. The keyword protocol 2000 defines here not only the control commands but also specifies the data contents which a standardized response to a standardized enquiry has to contain. For example, it is defined that for an $18 request, the associated §58 response in the data block for each fault code DTC1, DTC2-DTCn known in the control device, as well as the respective status of this fault code, are transmitted. The status of the fault code indicates here whether or not the self-diagnostic routine of the control device has tested the fault code. In the simplest case, the status can be composed of an individual bit, for example the bit value "0" stands for satisfactory checking of the functions assigned to the fault code in accordance with the test requirements, while the bit value "1" stands for a non-tested fault code or for a test run of the corresponding functions during which the test requirements were not present. Of course, any other coding means which is capable of deciding whether or not the status of a fault code has been tested in accordance with the test requirements for the functions on which the fault code is based can also be selected. The $58 response therefore contains, in the data block 7, a table with all the fault codes known in the control device, with the additional information. With an $18 request it is thus possible, either by setting corresponding parameters at the request itself or by subsequent selection of the data block of the associated $58 response, to identify and read out selectively all those fault codes whose status shows that the associated functions have not been tested satisfactorily in accordance with the test requirements for these functions. This information can be acquired completely independently of whether a malfunction was present or whether a fault code has been verified and has or has not been stored in the corresponding fault memory. In other words, it is possible to also interrogate non-activated fault codes about their status. The keyword protocol 2000 should be considered a particularly widespread embodiment variant in conjunction with the invention. The invention itself is not restricted to the keyword protocol 2000 but rather can also be carried out with any type or form of data transmission during which not only activated fault codes but also their status information can be read out and selected.

Figure 3:
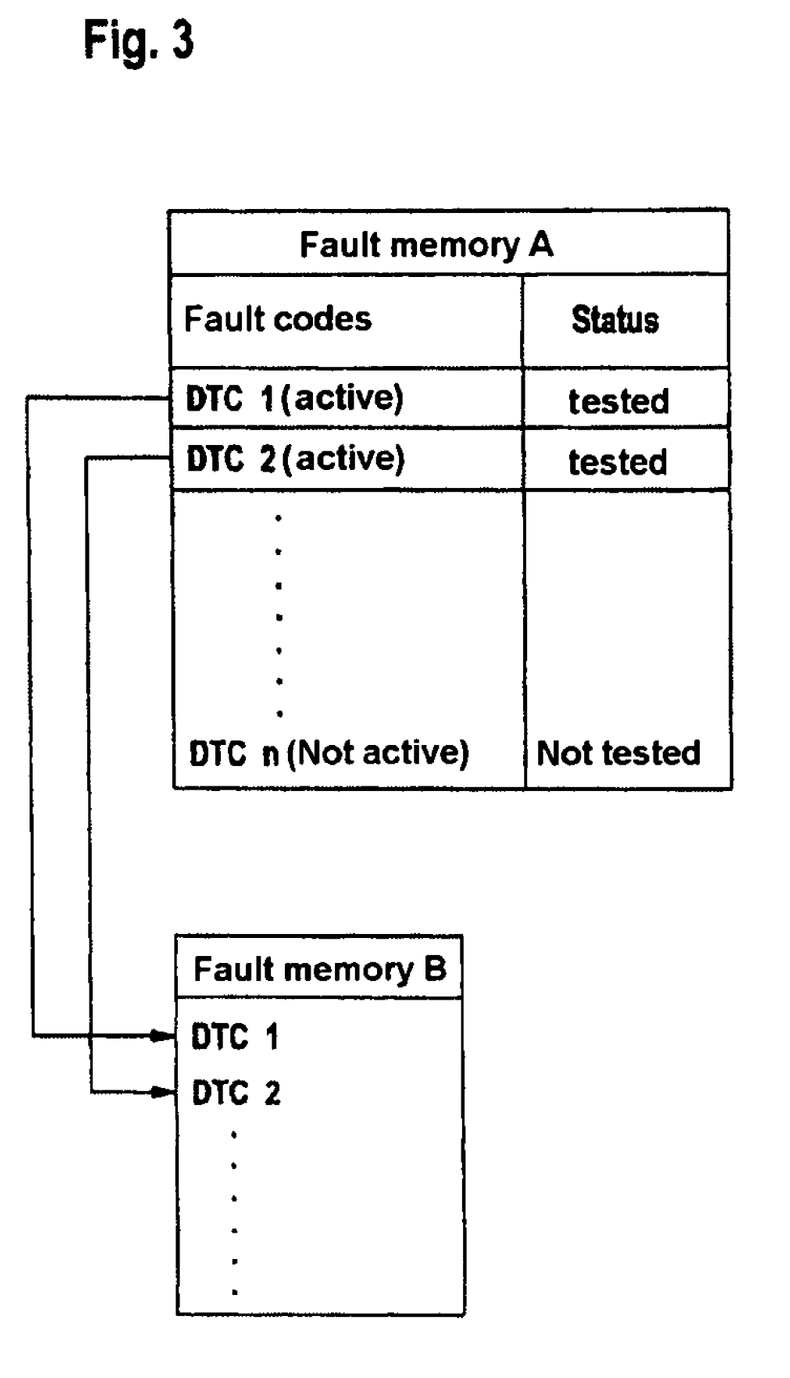
FIG. 3 shows a schematic illustration of the copying process of the fault codes from the primary fault memories into the secondary fault memory.

After the above-described bases for understanding the invention, details will now be given below on the core of the invention. The fault codes which are received with the $58 response, including their status, could per se be stored in a fault memory and the content of this fault memory could be displayed on the display of the diagnostic tester. The motor vehicle mechanic would then be provided with a list of all the identified malfunctions and could work through the list point for point in a repair process. In order to avoid losing an overview, he would certainly wish to clear all the processed fault codes by individual fault clearing from the fault memory after a repair has been concluded, so that afterwards it is indicated to him whether the processed fault codes have already been checked by the control device again. In the USA there is then the particular feature that diagnostics performed on motor vehicles are subject to strict legal regulations. In the context of the invention, one legal regulation which requires individual fault clearing of the fault codes detected during the diagnostics to be inadmissible when repairing and performing diagnostics on a motor vehicle is particularly relevant here. The prohibition on clearing individual faults applies particularly to fault codes which are relevant to exhaust gases. In the USA all that is permitted in this respect is to clear all the fault memory of a control device completely. Such a general clearing command is made available by the keyword protocol 2000 with the hexadecimal-coded $14FF00 request and the diagnostic service name: "clear diagnostic information". A disadvantage with this clear command is that when it is activated all the information which is relevant to diagnostics and is thus also relevant to repairs is lost. Therefore, in order to be able to carry out improved checking of repairs using a diagnostic tester even in the USA with the legally prescribed total reset of the fault memories, additional measures which form the core of this invention are necessary. The main idea of the invention here is to store all the diagnostic information which is relevant for checking of repairs to the motor vehicle in a second fault memory B and the separate handling of this fault memory B. Information which is relevant to diagnostics is here all the activated and tested fault codes. The schematic illustration in FIG. 3 clarifies in graphic form the introduction of a second fault memory B. The introduction of this second fault memory B makes it possible still to carry out a total reset of all the information which is relevant to diagnostics on the original primary fault memory A without having to fear loss of the diagnostic information which is necessary for checking of repairs. The diagnostic information which is necessary for checking of repairs is in fact buffered in the fault memory B. A total reset may not be applied to the second fault memory B.

Figure 4:
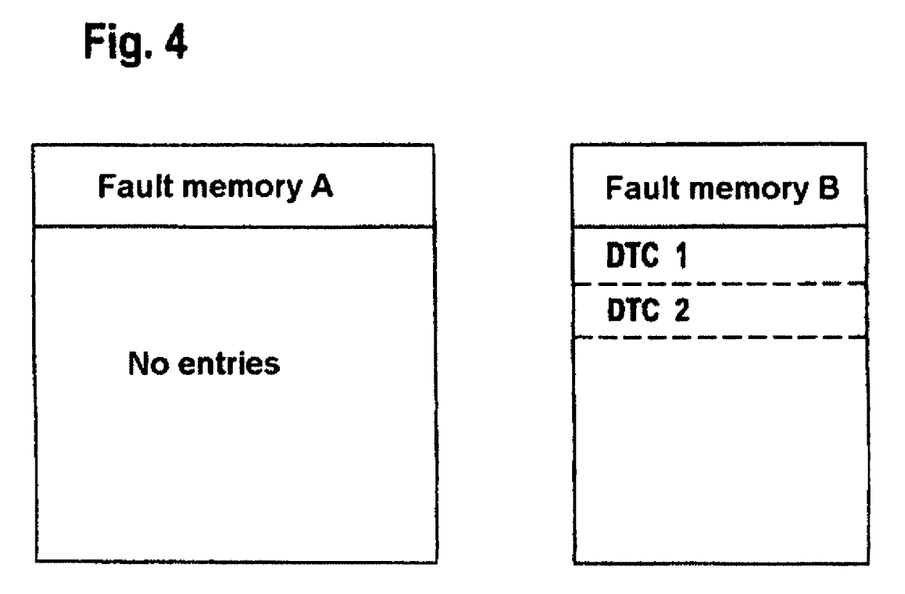
FIG. 4 shows the memory assignment of primary and secondary fault memories after a total reset of the primary fault memories.

After a repair has been carried out, the motor vehicle mechanic clears the diagnostic information in the primary fault memories A using a total reset. The triggering of this clear command is taken as a trigger signal to store the active fault codes from the primary fault memories in the secondary fault memory. After this copying process, the fault codes and the status information relating to the fault codes is cleared by means of this total reset in all the primary fault memories of the control devices. The secondary fault memory B remains untouched by this total reset. This situation is clarified with the graphic illustration in FIG. 4. All the diagnostic information which was previously found to be deficient continues to be stored in the second fault memory B.

Figure 5:
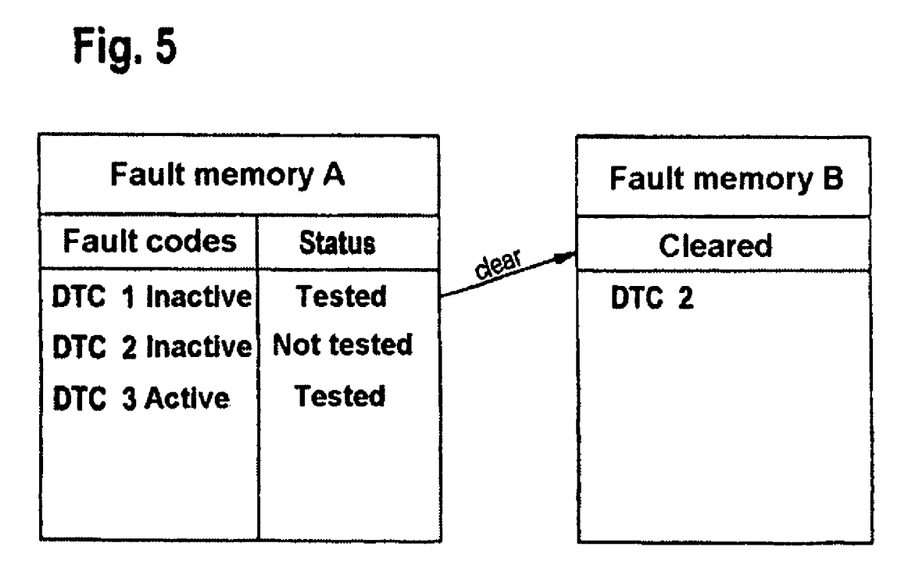
FIG. 5 shows a schematic illustration for the reconciliation of primary and secondary fault memories after a repair and after checking of a repair has taken place using the diagnostic tester.

Taking this diagnostic state as a basis, the secondary fault memory B must still be updated in accordance with the progress of the repair and in accordance with checking of the repair. This updating step will be clarified with the graphic illustration in FIG. 5. After the repair has been carried out and after a total reset of the primary fault memories has occurred, the motor vehicle mechanic will carry out a test run with the repaired vehicle. In this test run, the self-diagnostic routines of the control devices in the motor vehicle are activated and again supply diagnostic information relating to activated or inactive fault codes as well as diagnostic information relating to the status of all the known fault codes, whether or not the respective fault code has been tested. This diagnostic information is written again into the primary fault memories A by the control devices. When the diagnostic information is read out of the primary fault memories A again, reconciliation with the fault memory B can take place using the diagnostic tester and its implemented diagnostic program. This reconciliation checks which fault codes can be cleared in the second fault memory B after repair has occurred. All those fault codes which have been tested by the self-diagnostic routines of the control devices can be cleared. All those fault codes which have not been tested by the self-diagnostic routines during the test run cannot be cleared. In the exemplary embodiment in FIG. 5, this would be the fault code DTC2 which has not been tested and therefore has to remain in the fault memory B. The fault code DTC1 could be cleared since it has been tested by the self-diagnostic routines. Fault codes which have not been tested actively until after the repair has taken place can, if appropriate, be newly transferred into the secondary fault memory A. In the illustrated exemplary embodiment in FIG. 5, this would be the fault code DTC3 which has been tested positively and is now active. After partial repair has occurred and after a test run has occurred, the entirety of the contents of the primary fault memories A and of the secondary fault memory B thus contains the deficiency situation after partial repair and test run. If the fault list of the active fault codes from the primary fault memories A and the list of the still untested, original fault codes in the secondary fault memory B is displayed to the motor vehicle mechanic using the diagnostic tester on its display, the motor vehicle mechanic is thus provided with information as to which repairs were successful and which are still to be sorted out.

Figure 6:
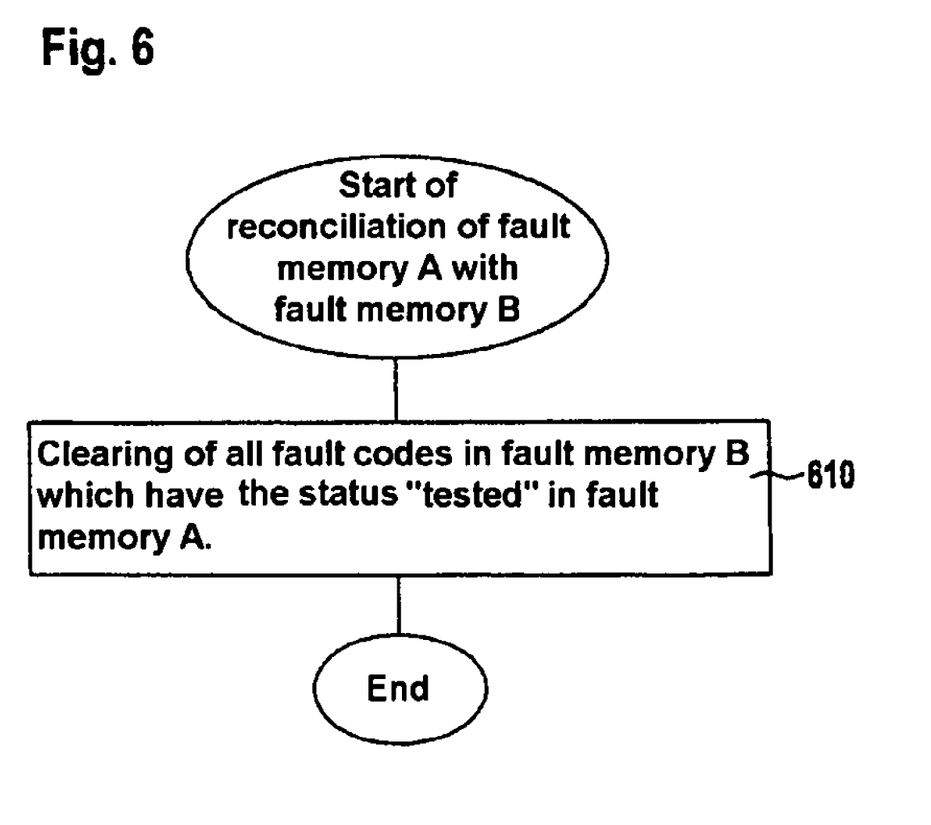
FIG. 6 shows a flowchart showing improved checking of a repair using a diagnostic tester.

The reconciliation of primary fault memories A with the secondary fault memory B described above in conjunction with the two FIGS. 4 and 5 can be implemented relatively easily by means of program technology in a diagnostic tester. FIG. 6 shows here by way of example a program flowchart with which the secondary fault memory B can be reconciled with the primary fault memories A. The flowchart mainly comprises both the start and end from the method steps 610 which are necessary to clear tested fault codes from the secondary fault memory. After a first repair and after a first test run, the secondary fault memory B is updated by clearing in the fault memory B all those fault codes which have the status "tested" after the test run and after status polling in the primary fault memories A. After this reconciliation, the fault list which is stored in the fault memory B is displayed to the motor vehicle mechanic on the diagnostic tester, if appropriate together with the list of the active fault codes from the primary fault memories.

Figure 7:
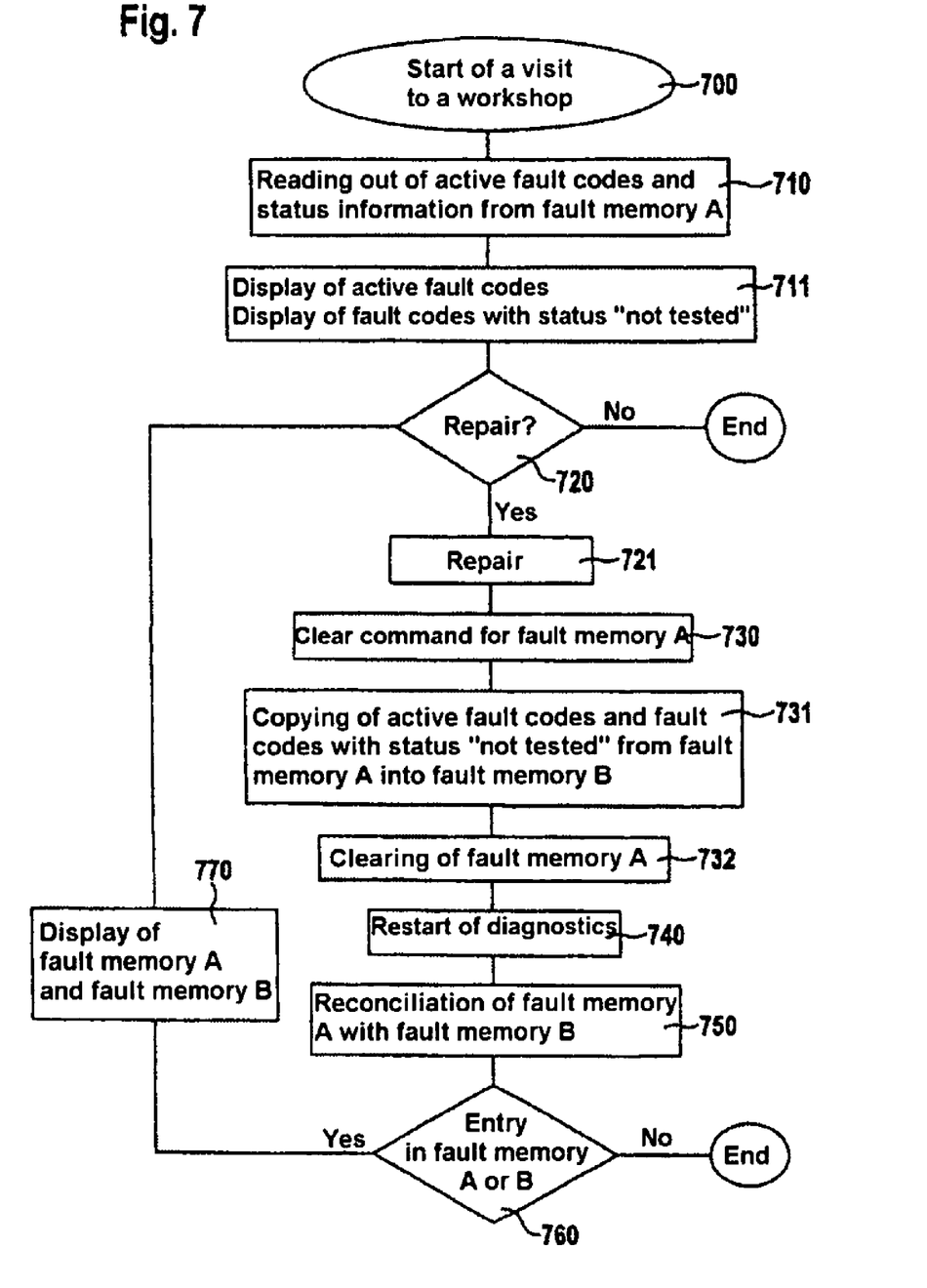
FIG. 7 is a further possible flowchart for improved checking of repairs using a diagnostic tester.

To summarize, a program flowchart can thus be set up for improved checking of repairs and implemented as a diagnostic program in a diagnostic tester. FIG. 7 illustrates by way of example such a program flowchart in a graphic form. After the motor vehicle has arrived in the workshop, the diagnostic tester is firstly connected to the diagnostic interface of the motor vehicle. The process with the improved checking of repairs is started using the diagnostic tester 700. In a first method step 710, all the fault codes from the primary fault memories A and all the status information relating to all the known fault codes are read out. The status information is evaluated and selected. Of interest are all active fault codes and all those fault codes which have not been checked by the self-diagnostic routines of the control devices. These fault codes have the status "not tested". All the active fault codes as well as all those fault codes with the "not tested" status will be displayed and further processed here. By reference to the display on the diagnostic tester the motor vehicle mechanic then decides whether or not a repair is to be carried out. This decision process is also performed with the diagnostic tester and is illustrated symbolically in FIG. 7 with the reference numeral 720. If a repair occurs, illustrated by the reference number 721, the content of the primary fault memories A is cleared with a command for total reset after the repair has been concluded or at least after a partial repair has been concluded. The clear command 730 is taken here as a trigger signal to copy at least the active fault codes from the primary fault memories and the secondary fault memory. This corresponds in FIG. 7 to the method step with the reference numeral 731. After the copying process, the primary fault memories are cleared 732 by total reset. As a result, all the diagnostic information in the primary fault memories A is initially lost. In order to check a repair, a test run takes place in a further method step with the reference numeral 740. During this test run, which is generally a type of test drive with the motor vehicle, self-diagnostic routines of the control devices in the motor vehicle are activated. If faults continue to occur, the activated fault codes are read into the primary fault memories A again by the self-diagnostic routines, and likewise the status information relating to all the known fault codes can be determined from the self-diagnostic routines. Likewise, after a test run has taken place it is thus in turn possible to read out and determine activated fault codes and status information from the primary fault memories.

The secondary fault memory B is then updated in a further method step 750 such as has already been described in conjunction with the reconciliation of the two fault memories A and B in conjunction with FIG. 6. After the primary fault memories A have been reconciled with the contents of the second fault memory B, the updated content of the fault memory B is displayed to the motor vehicle mechanic on the diagnostic tester together with the current active fault codes which, if appropriate, have been newly stored in the primary fault memories of the control devices. The repair is successfully ended here if there are no fault codes in the fault memory B or in the primary fault memories, which becomes apparent to the motor vehicle mechanic by virtue of the fact that a deficiency list is no longer displayed on the display of the diagnostic tester. If there are entries in the fault memory B, corresponding deficiencies are displayed on the diagnostic tester. This decision process is illustrated in the program flowchart in FIG. 7 using the reference numeral 760. Such a decision is implemented in terms of program technology by a yes/no interrogation as to whether or not fault codes are stored in the secondary fault memory B or the primary fault memories A. If a display is given on the display of the diagnostic tester, represented symbolically by the method step with the reference numeral 770, the repair process starts anew. The resetting of the repair process is expediently implemented with a program loop. A possible starting point for the program loop is here the method step with the reference numeral 720 according to FIG. 7. Other starting points can also be the method step with the reference numeral 711. At a starting point according to method step 711, a method step with the reference numeral 770 can be dispensed with.

Figure 8:
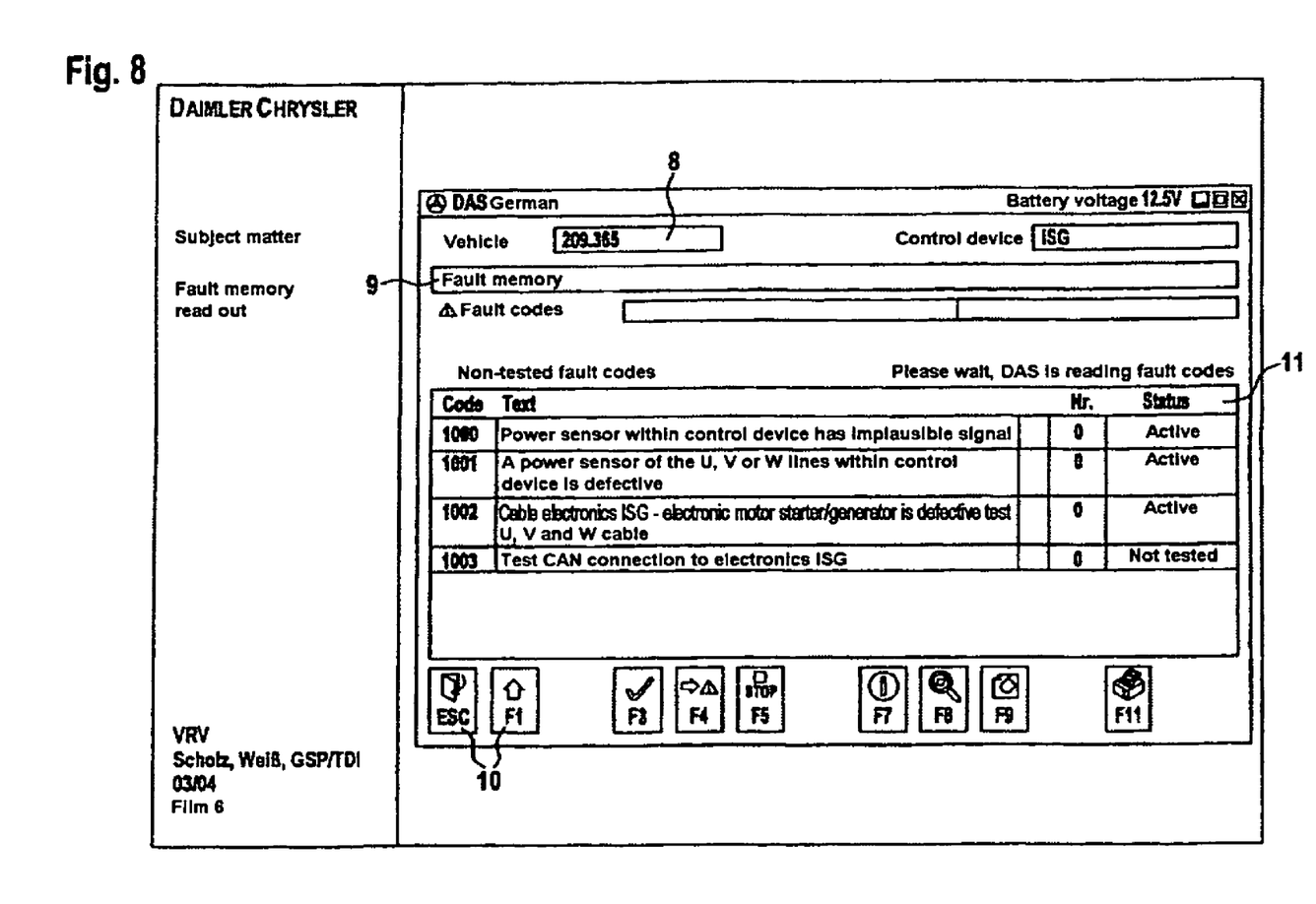
FIG. 8 shows a graphic user interface such as is displayed to the motor vehicle mechanic by the diagnostic tester.
Figure 9:
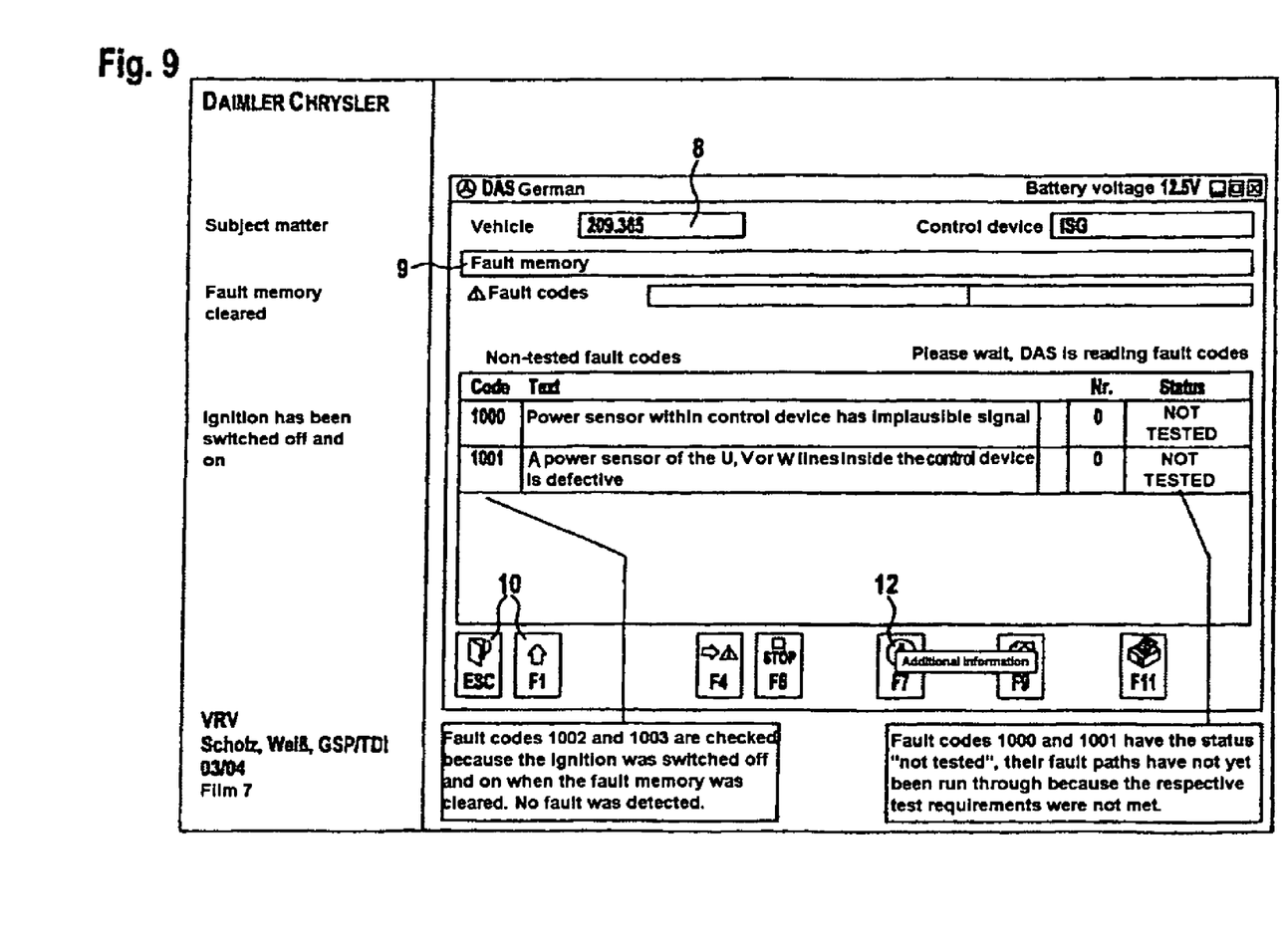
FIG. 9 shows the graphic user interface of the diagnostic tester according to FIG. 5, in the form in which it appears to the motor vehicle mechanic after the repairs have been carried out but the repairs themselves have not been satisfactorily checked.

FIGS. 8 and 9 illustrate how the improved checking of repairs can be implemented using the diagnostic tester. Typical screen shots of the display on the diagnostic tester are illustrated. In addition to information relating to the examined vehicle 8 relating to the displayed data content 9, the motor vehicle mechanic is provided, on the user interface of the diagnostic tester in the form of what are referred to as buttons 10, with operator control elements with which he can control and operate the diagnostic tester. The main point of the invention is to display all the active fault codes which could be found by the diagnostic tester in the control devices of the motor vehicle. In the illustrated example, these are the fault codes 1000, 1001 and 1002. In addition, not only the activated fault codes which are referred to as "active" in the display according to FIG. 8 are displayed but also those fault codes which have the status "not tested" can be displayed. In the exemplary embodiment in FIG. 8, this is the fault code 1003. The screen shot according to FIG. 8 is intended to illustrate by way of example the display which is displayed to the motor vehicle mechanic on the diagnostic tester after the diagnostic tester has been connected to the diagnostic interface and after transmission of data has occurred and after data selection has occurred. The motor vehicle mechanic can call up further information relating to the individual fault codes using the operator control button 10 by menu prompting, for example by means of a pull down menu. For example, the repair instructions which relate to the respective fault code and which are generally likewise integrated and stored in the diagnostic program of the diagnostic tester are of particular interest. After total repair has occurred, the motor vehicle mechanic can start checking the repairs using operator control buttons 10.

A possible result of checking of a repair which has been carried out in this way is illustrated with the screenshot according to FIG. 9. In the exemplary embodiment which is selected by way of example according to FIG. 8, all the repairs relating to the fault codes 1000, 1001, 1002, 1003 have been carried out. However, the checking of repairs which has then been started has shown that for two of the four fault codes the test requirements to test the satisfactory function of the respective functions using the self-diagnostic routines of the respective control devices were not met. These two fault codes have remained in the secondary fault memory B. For this reason, this fact is displayed to the motor vehicle mechanic. He is given an indication of which fault code which was previously found to be deficient could not be tested after the repair had occurred. The prescribed test requirements are particularly expediently also stored for each fault code in the database system of the diagnostic tester. A specific information button 12 whose activation allows additional information about a selected fault code, for example fault code 1000, to be called up by menu selection is expediently implemented for calling up these test requirements. This additional information can contain not only the test requirements but also information about which test requirements were not met. In the illustrated exemplary embodiment the necessary minimum rotational speed of the on-board power system generator might not have been reached so that the untested power sensors fault codes 1000, 1001 cannot be tested at all. The motor vehicle mechanic is then provided with a message that he must increase the rotational speed of the motor vehicle engine to at least, for example, 2000 revolutions per minute for successful checking.

Checking of repairs is not concluded successfully until the diagnostic tester no longer displays any fault codes, i.e. the primary fault memories A no longer contain any active fault and all the entries in the secondary fault memory B have been cleared after the test and status polling have taken place.

The invention claimed is:

1. A computer-based diagnostic tester with a diagnostic program and a diagnostic interface for connecting the diagnostic tester to a group of control devices on which diagnostics are to be performed, wherein:
    fault codes and status information relating to fault codes are read out and evaluated from primary fault memories (A), in particular from the control devices, using the diagnostic program,
    all the fault codes whose fault setting conditions are met or additionally all the fault codes whose status information indicates that the respective fault codes have not been checked are stored in a secondary fault memory (B) and displayed using the diagnostic tester,
    a clear command cears the diagnostic information in the primary fault memories while the secondary fault memory remains untouched by said clear command, and
    the secondary fault memory is updated by reconciliation with subsequent data from the primary fault memories.

2. The diagnostic tester as claimed in claim 1, wherein the fault codes in the secondary fault memory (B) are cleared only if a status check has yielded that a successful diagnostic run has taken place for the fault codes to be cleared.

3. The diagnostic tester as claimed in claim 1, wherein the status information of selectable fault codes can be interrogated during a repair.

4. The diagnostic tester as claimed in claim 1, wherein the status check is triggered on a timed basis.

5. The diagnostic tester as claimed in claim 1, wherein the fault codes in the primary fault memories (A) are cleared by means of a general clear command.

6. The diagnostic tester as claimed in claim 1, wherein after a repair and after a subsequently executed diagnostic run the content of the secondary fault memory (B) is updated with the contents of the primary fault memories (A).

7. The diagnostic tester as claimed in claim 1, wherein both the active fault codes from the primary fault memories and the fault codes stored in the secondary fault memory are displayed together on the display of the diagnostic tester.

8. A diagnostic system for checking motor vehicle control devices, the motor vehicle control devices having self-diagnostic routines which, in the event of malfunctions, store fault codes in motor vehicle-mounted primary fault memories (A), and these primary fault memories can be connected to an external diagnostic tester via a diagnostic interface, a diagnostic program being implemented in the diagnostic tester, wherein:
    fault codes and status information relating to fault codes are read out from the primary fault memories and evaluated using the diagnostic program,
    all the fault codes whose fault setting conditions are met or additionally all the fault codes whose status information indicates that the respective fault codes have not been checked are stored in a secondary fault memory (B) and displayed using the diagnostic tester,
    a clear command dears the diagnostic information in the primary fault memories while the secondary fault memory remains untouched by said clear command, and
    the secondary fault memory is updated by reconciliation with subsequent data from the primary fault memories.

9. The diagnostic system as claimed in claim 8, wherein fault codes in the secondary fault memory (B) are cleared only if a status check has yielded that a successful diagnostic run has taken place for the fault codes to be cleared.

10. The diagnostic system as claimed in claim 8, wherein the status information of selectable fault codes can be interrogated during a repair.

11. The diagnostic system as claimed in claim 8, wherein the status check is triggered on a timed basis.

12. The diagnostic system as claimed in claim 8, wherein the fault codes in the primary fault memories (A) are cleared by means of a general clear command.

13. The diagnostic system as claimed in claim 8, wherein after a repair and after a subsequently executed diagnostic run the content of the secondary fault memory (B) is updated with the contents of the primary fault memories (A).

14. Diagnostics as claimed in claim 8, wherein both the active fault codes from the primary fault memories and the fault codes stored in the secondary fault memory are displayed on the display of the diagnostic tester.

15. A method for improved checking of repairs, in which firstly fault codes are determined using self-diagnostic routines of control devices and are stored in at least one primary fault memory (A), wherein:
    the fault codes which are determined are displayed on the display of the diagnostic tester and at least a partial repair is carried out by means of the fault codes which are determined,
    in a further method step after a repair has been carried out, the fault codes which are determined are copied into a secondary fault memory (B) from the primary fault memories (A),
    after this copying process, the primary fault memories are cleared,
    in a further method step using the self-diagnostic routines of the control devices, a further diagnostic run is started, and
    after the further diagnostic run, the content of the secondary fault memory (B) is reconciled with the contents of the primary fault memories (A) by clearing from the secondary fault memory (B) those fault codes which have been tested by the self-diagnostic routines of the control devices.

16. The method as claimed in claim 15, wherein the fault codes which are determined all comprise active fault codes.

17. The method as claimed in claim 16, wherein the fault codes which are determined additionally comprise those fault codes whose status polling has yielded the status "not tested".

18. The method as claimed in claim 15, wherein, after a further diagnostic run, both the active fault codes from the primary fault memories (A) and the non-cleared fault codes from the secondary fault memory (B) are displayed on the diagnostic tester.

* * * * *